US007693292B1

(12) United States Patent
Gross et al.

(10) Patent No.: US 7,693,292 B1
(45) Date of Patent: Apr. 6, 2010

(54) METHOD AND APPARATUS FOR CANCELING FAN NOISE IN A COMPUTER SYSTEM

(75) Inventors: Kenny C. Gross, San Diego, CA (US); Aleksey Urmanov, San Diego, CA (US); Anton Bougaev, Lafayette, IN (US)

(73) Assignee: Sun Microsystems, Inc., Santa Clara, CA (US)

( * ) Notice: Subject to any disclaimer, the term of this patent is extended or adjusted under 35 U.S.C. 154(b) by 1268 days.

(21) Appl. No.: 11/205,473

(22) Filed: Aug. 16, 2005

(51) Int. Cl.
*H03B 29/00* (2006.01)

(52) U.S. Cl. ................................ 381/71.14; 381/71.12

(58) Field of Classification Search ............. 381/71.13, 381/71.3, 71.9, 94.7, 71.11, 94.1, 71.12, 381/94.2, 94.3, 71.14, 71.5, 71.8; 181/206; 700/280

See application file for complete search history.

(56) References Cited

U.S. PATENT DOCUMENTS

2003/0123675 A1* 7/2003 Culman et al. ............. 381/71.1
2005/0069144 A1* 3/2005 Delchar et al. ............. 381/71.3

* cited by examiner

*Primary Examiner*—Vivian Chin
*Assistant Examiner*—Kile Blair
(74) *Attorney, Agent, or Firm*—Park, Vaughan & Fleming LLP

(57) ABSTRACT

One embodiment of the present invention provides a system that cancels fan noise in a computer system. During operation, the system obtains a fan noise signal using a microphone. Next, the system generates a spectral pattern based on the obtained fan noise signal. The system then uses the spectral pattern to identify a corresponding cancellation spectrum in an anti-spectra library. Next, the system generates a noise-canceling signal using the cancellation spectrum. Note that the amount of computation required to cancel fan noise is reduced because generating the noise-canceling signal using the anti-spectra library requires less computation than generating the noise-canceling signal using dynamic noise-cancellation techniques.

21 Claims, 4 Drawing Sheets

METHOD AND APPARATUS FOR CANCELING FAN NOISE IN A COMPUTER SYSTEM

BACKGROUND

1. Field of the Invention

The present invention relates to techniques for canceling fan noise in computer systems. More specifically, the present invention relates to a method and an apparatus for canceling fan noise in a computer system by using an anti-spectra library.

2. Related Art

Rapid advances in computing technology presently make it possible to perform trillions of operations each second on data sets that are sometimes as large as a trillion bytes. These advances can be largely attributed to the exponential increase in the density and complexity of integrated circuits.

Unfortunately, in conjunction with the increase in density and complexity, the power consumption and heat dissipation of integrated circuits has also increased dramatically.

Specifically, high-end server systems can easily generate 20 kilowatts or more heat. Servers typically use powerful fans to remove heat, which can generate high levels of noise. In fact, a datacenter full of high-end servers can produce a very high decibel roar from all of the fan noise which can cause human errors while servicing high-end servers. Specifically, high noise levels can make it difficult for service engineers to communicate with each other. Service engineers may even have to use sign language to communicate with one another. High noise levels can also make it difficult for individual engineers to concentrate on the complex tasks they undertake in the datacenter. Specifically, noise levels can cause human errors that result in "No Trouble Found" (NTF) problems at customer sites, which can result in a huge cost to the server manufacture as well as causing customer dissatisfaction. Hence, techniques for reducing or eliminating fan noise are very important. These techniques are often called Automatic Noise Cancellation (ANC) techniques, or simply, noise cancellation techniques.

Present noise cancellation techniques are costly and computationally intensive. This is because present approaches sense the harmonics of a fan noise signal in real time, and then use dynamic feedback and control methods to cancel as much of the fan noise signal as possible. Since these techniques are executed in real time, they can significantly increase the computational burden on the server, which can decrease server performance.

Hence, what is needed is a method and an apparatus for canceling fan noise in a computer system without the above-described problems.

SUMMARY

One embodiment of the present invention provides a system that cancels fan noise in a computer system. During operation, the system obtains a fan noise signal using a microphone. Next, the system generates a spectral pattern based on the obtained fan noise signal. The system then uses the spectral pattern to identify a corresponding cancellation spectrum in an anti-spectra library. Next, the system generates a noise-canceling signal using the cancellation spectrum. Note that the amount of computation required to cancel fan noise is reduced because generating the noise-canceling signal using the anti-spectra library requires less computation than generating the noise-canceling signal using dynamic noise-cancellation techniques.

In a variation on this embodiment, the system computes cancellation spectra based on fan noise signals measured at various fan speeds, and stores the cancellation spectra in the anti-spectra library.

In a variation on this embodiment, the system identifies the cancellation spectrum by first determining a fan speed based on the spectral pattern. Next, the system identifies the cancellation spectrum in the anti-spectra library based on the fan speed.

In a variation on this embodiment, generating the noise-canceling signal involves playing back the noise canceling signal on a speaker.

In a variation on this embodiment, the system detects one or more fan failures. Next, the system performs noise cancellation only if no fan failures are detected. Note that the anti-spectra library typically stores cancellation spectra for system configurations in which all fans are operational. Hence, if one or more fans fail, the obtained noise spectrum may be different from the cancellation spectra stored in the anti-spectra library, which can result in suboptimal noise cancellation.

In a further variation on this embodiment, the system detects one or more fan failures by determining a thermal distribution using thermal sensors. Note that an anomalous thermal distribution can indicate a fan failure. Further, the system also detects one or more fan failures by determining whether a fan speed is below a normal operating speed using a Hall-effect RPM (revolution per minute) sensor.

In a further variation on this embodiment, the thermal distribution can be used to validate the output of the Hall-effect RPM sensor, thereby improving fan operability assurance.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Fan Noise Cancellation Using an Anti-Spectra Library

Figure 1A:
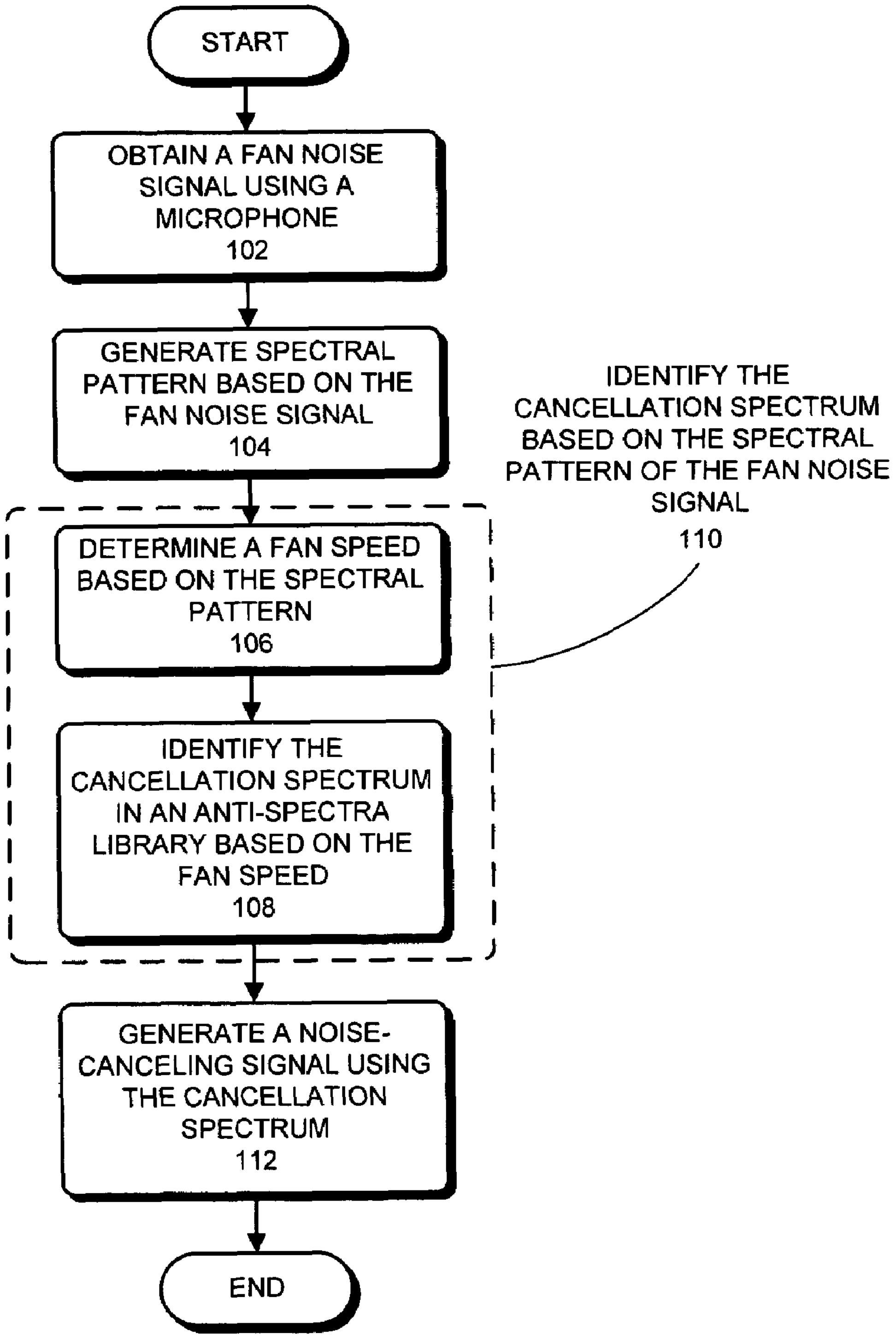
FIG. 1A presents a flow chart that illustrates a process for canceling fan noise in a server using an anti-spectra library in accordance with an embodiment of the present invention.

FIG. 1A presents a flow chart that illustrates a process of canceling fan noise in a server using an anti-spectra library in accordance with an embodiment of the present invention.

Figure 2:
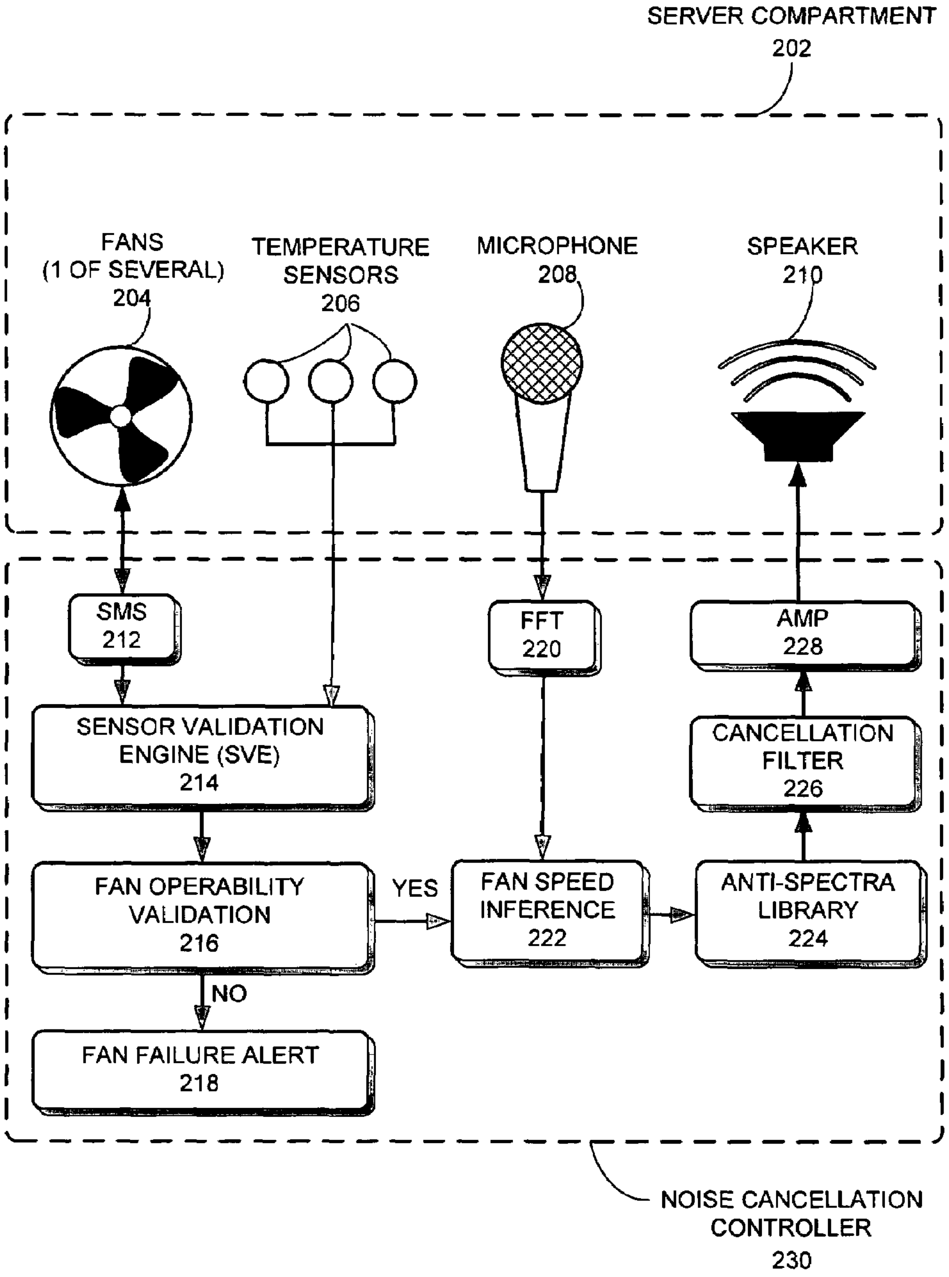
FIG. 2 illustrates a schematic diagram of a high-end server system that can cancel fan noise in accordance with an embodiment of the present invention.

FIG. 1A should be viewed in relation to FIG. 2 which illustrates a schematic diagram of a high-end server system that can cancel fan noise in accordance with an embodiment of the present invention. The system shown in FIG. 1A comprises two sub-systems: a server compartment 202 and a noise cancellation controller 230.

The noise-cancellation process typically begins with obtaining a fan noise signal using a microphone (step 102). The recorded signal is generally a continuous time-domain waveform which represents the noise from all the fans in a server. Note that the fan noise signal can be measured by an inexpensive microphone 208 that resides inside the server compartment 202.

Next, the system generates a spectral pattern based on the fan noise signal (step 104). Note that the system can use a Fast-Fourier Transform (FFT) to generate the spectral pattern as shown by component FFT 220 in FIG. 2.

Next, the system identifies a cancellation-spectrum in an anti-spectra library which contains a complete collection of cancellation spectra for all possible fan-speed combinations. This library is typically pre-computed and stored in a computer-readable storage medium.

Note that each server usually contains multiple fans. Furthermore, each fan can run at multiple speeds, measured in revolutions per minute (RPM). Hence, any given time, each fan may run at a different speed as determined by the server. Consequently, for each combination of fan speeds, the spectral pattern generated from the noise signal can be unique. In one embodiment, the anti-spectra library stores an anti-spectral pattern for every unique combination of fan speeds.

Figure 1B:
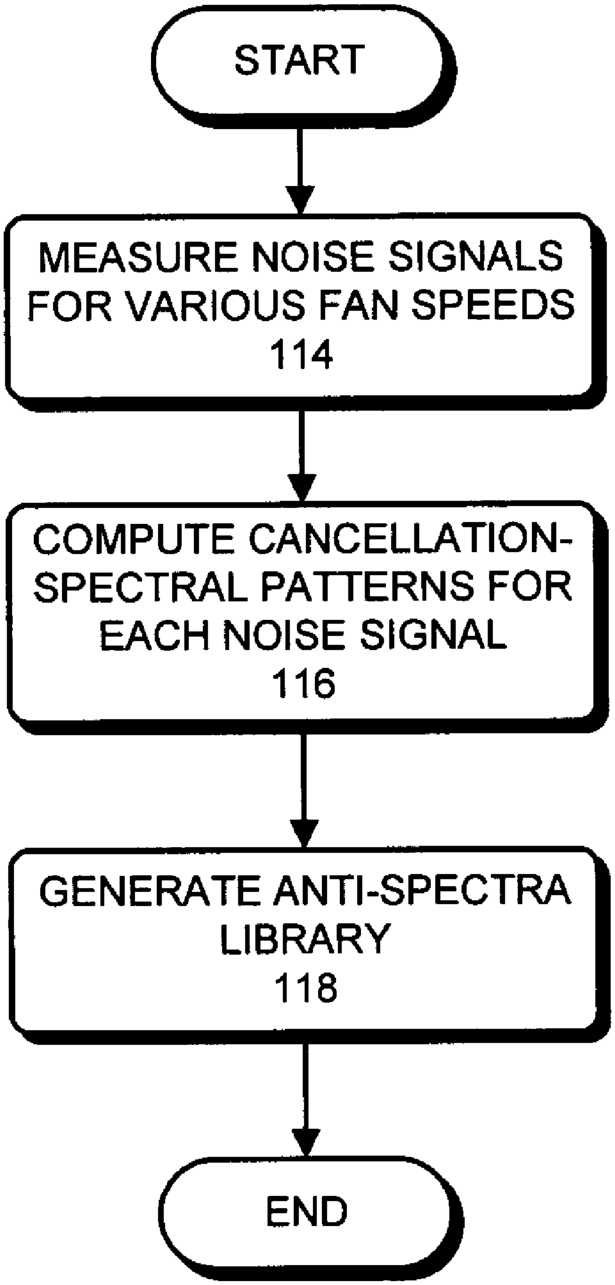
FIG. 1B presents a flow chart that illustrates a process for generating an anti-spectra library in accordance with an embodiment of the present invention.

FIG. 1B presents a flow chart that illustrates a process for generating an anti-spectra library in accordance with an embodiment of the present invention.

The process typically begins by measuring noise signals at various fan speed combinations (step 114).

Next, the system computes a cancellation spectrum for each noise spectral pattern (step 116).

Finally, the system stores all the cancellation-spectra in the anti-spectra library (step 118).

Continuing with FIG. 1A, the system then identifies the cancellation spectrum based on the spectral pattern of the fan noise signal (step 110).

In one embodiment of the present invention, all fans in the server are locked onto the same speed at any given time. In such cases, the system first determines the fan speed by a simple pattern match in the frequency-domain (step 106). In FIG. 2, this step is performed by the fan speed inference component 222.

Next, the system identifies the correct cancellation spectrum in the anti-spectra library 224 based on the inferred fan speed (step 108).

Finally, the system generates a noise-canceling signal using the identified cancellation spectrum (step 112).

For example, the noise-canceling signal can be generated by first using cancellation filter 226 to retain the human audible portion of the cancellation spectrum. Next, the signal can be sent to amplifier 228. Finally, the cancellation spectrum can be played back in server compartment 202 by speaker 210. Note that the noise cancellation waveform is ideally 180 degree phase shifted from the fan noise waveform for the optimal cancellation effect.

Determining Fan Failure in a Server

The anti-spectra library typically stores cancellation spectra for system configurations in which all fans are operational. Hence, if one or more fans fail, the obtained noise spectrum may be different from the cancellation spectra stored in the anti-spectra library. This can result in suboptimal noise cancellation. Consequently, reliably detecting fan failures is very important because it can allow the system to stop noise-cancellation when a fan failure occurs, thereby preventing suboptimal noise-cancellation.

Figure 3:
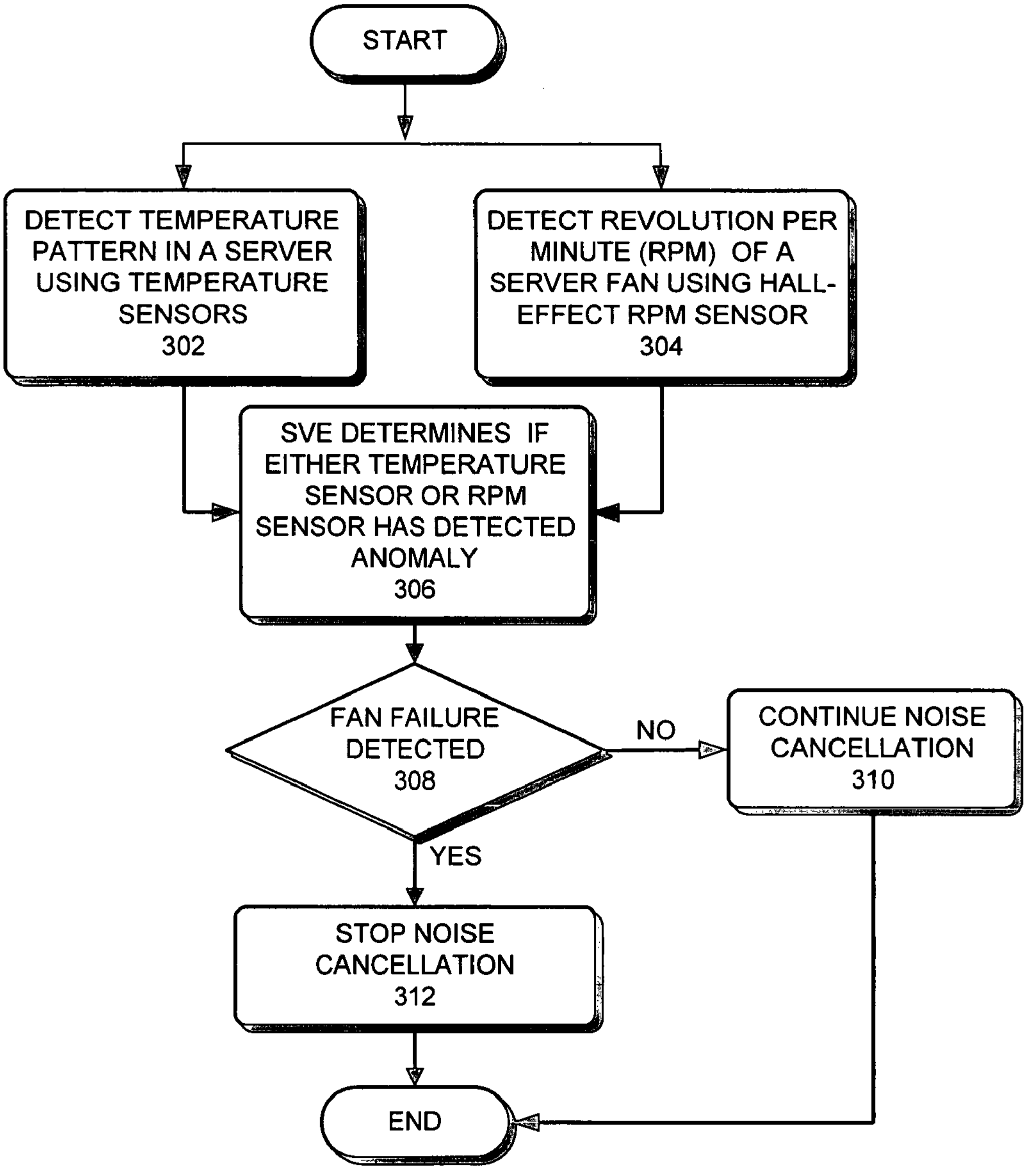
FIG. 3 presents a flow chart that illustrates a process of determining one or more fan failures using temperature sensors and Hall-effect RPM sensors in accordance with an embodiment of the present invention.

FIG. 3 presents a flow chart that illustrates a process for determining one or more fan failures using temperature sensors and Hall-effect RPM sensors in accordance with an embodiment of the present invention.

The process typically begins with determining a temperature distribution (pattern) in a server using temperature sensors (step 302). These sensors create a temperature map of the server in real time. For example, temperature sensors 206 in FIG. 2 can be used to determine a temperature pattern in server 202.

Once a temperature pattern is determined, pattern recognition techniques can be used to compare (or match) the temperature pattern with temperature patterns that are known to be associated with fan failures. In one embodiment, multivariate state estimation technique (MSET) can be used for pattern recognition. In another embodiment, pattern recognition can be performed using a class of techniques known as nonlinear, nonparametric (NLNP) regression. Yet another embodiment can use neural networks for pattern recognition. In general, the pattern recognition module "learns" the behavior of the monitored temperature variables during a training period and is able to estimate what each signal "should be" on the basis of past learned behavior and on the basis of the current readings from all the correlated temperature variables. For example, a Sensor Validation Engine (SVE) 214 can be used to detect anomalies in the temperature pattern. Specifically, a fan failure may be inferred if SVE 214 detects an anomaly in the current temperature pattern.

Fans 204 can contain Hall-effect RPM sensors or fan sensors which can determine whether the fan speeds are above or below normal operating speeds. The sensors can then flag those fans whose speeds are measured to be below the normal operating speeds. Specifically, a System Management Services (SMS) component 212 can be coupled with the Hall-effect RPM sensors to detect fan failures.

In one embodiment, SVE 214 validates the outputs from both the temperature sensors and fan sensors as shown in FIG. 2 and then makes fan failure decisions using fan operability validation component 216.

If either the temperature sensors or the fan sensors indicate a fan failure, a fan failure alert 218 is triggered that stops noise cancellation process and the system is serviced to fix the fan failures.

On the other hand, if no fan failure is detected by SVE 214, the noise cancellation process proceeds as usual without interruption.

Note that, using temperature sensors in a server to detect one or more fan failures is typically more reliable than using Hall-effect RPM sensors alone which usually cannot detect fan failures with high reliability. The reason is that there is usually so much wind flowing through a high-end server system that it is possible for a fan motor to fail but still have the fan blades to keep turning (because of the wind). In such cases the Hall-effect RPM sensors which detect fan failures based on the fan speeds relative to certain thresholds are not able to generate a fan motor failure warning. In contrast, temperature patterns obtained by the temperature sensors are being continuously validated by pattern recognition engine, which truthfully reflect any subtle changes in the fan speeds. Consequently, the temperature sensors can be used to validate the outputs generated by the Hall-effect RPM sensors, which can improve fan operability assurance. Further, in one embodiment, the system may use only temperature sensors to detect fan failures.

Note that using the anti-spectra library to generate the noise-canceling signal, instead of dynamically generating the noise-canceling signal, can reduce the amount of computation required for canceling fan noise, which can free up compute resources.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for canceling fan noise in a computer system, the method comprising:

obtaining a fan noise signal using a microphone;

generating a spectral pattern based on the obtained fan noise signal;

identifying a cancellation spectrum in an anti-spectra library using the spectral pattern, wherein the anti-spectra library includes at least one cancellation spectrum computed based on a fan noise signal that includes a combination of multiple fan speeds; and generating a noise-canceling signal using the cancellation spectrum;

wherein the amount of computation required to cancel fan noise is reduced because generating the noise-canceling signal using the anti-spectra library requires less computation than dynamically generating the noise-canceling signal.

2. The method of claim 1, further comprising:

computing cancellation spectra based on fan noise signals measured at various fan speeds; and storing the cancellation spectra in the anti-spectra library.

3. The method of claim 1, wherein identifying the cancellation spectrum involves:

determining a fan speed based on the spectral pattern; and identifying the cancellation spectrum based on the fan speed.

4. The method of claim 1, wherein generating the noise canceling signal involves playing back the noise canceling signal on a speaker.

5. The method of claim 1, further comprising:

detecting one or more fan failures; and stopping noise-cancellation if one or more fan failures are detected, wherein stopping noise-cancellation can prevent suboptimal noise-cancellation because, if one or more fans fail, the spectral pattern can be substantially different from the cancellation spectrum which is associated with a system configuration in which all fans are operational.

6. The method of claim 5, wherein detecting one or more fan failures involves:

determining a thermal distribution using thermal sensors, wherein an anomalous thermal distribution can indicate a fan failure; and determining whether a fan speed is below a normal operating speed using a Hall-effect RPM (revolution per minute) sensor.

7. The method of claim 6, wherein the thermal distribution can be used to validate the output of the Hall-effect RPM sensor, thereby improving fan operability assurance.

8. A computer-readable storage medium storing instructions that when executed by a computer cause the computer to perform a method for canceling fan noise in a computer system, the method comprising:

obtaining a fan noise signal using a microphone;

generating a spectral pattern based on the obtained fan noise signal;

identifying a cancellation spectrum in an anti-spectra library using the spectral pattern, wherein the anti-spectra library includes at least one cancellation spectrum computed based on a fan noise signal that includes a combination of multiple fan speeds; and generating a noise-canceling signal using the cancellation spectrum;

wherein the amount of computation required to cancel fan noise is reduced because generating the noise-canceling signal using the anti-spectra library requires less computation than dynamically generating the noise-canceling signal.

9. The computer-readable storage medium of claim 8, wherein the method further comprises:

computing cancellation spectra based on fan noise signals measured at various fan speeds; and storing the cancellation spectra in the anti-spectra library.

10. The computer-readable storage medium of claim 8, wherein identifying the cancellation spectrum involves:

determining a fan speed based on the spectral pattern; and identifying the cancellation spectrum based on the fan speed.

11. The computer-readable storage medium of claim 8, wherein generating the noise canceling signal involves playing back the noise canceling signal on a speaker.

12. The computer-readable storage medium of claim 8, wherein the method further comprises:

detecting one or more fan failures; and stopping noise-cancellation if one or more fan failures are detected, wherein stopping noise-cancellation can prevent suboptimal noise-cancellation because, if one or more fans fail, the spectral pattern can be substantially different from the cancellation spectrum which is associated with a system configuration in which all fans are operational.

13. The computer-readable storage medium of claim 12, wherein detecting one or more fan failures involves:

determining a thermal distribution using thermal sensors, wherein an anomalous thermal distribution can indicate a fan failure; and determining whether a fan speed is below a normal operating speed using a Hall-effect RPM (revolution per minute) sensor.

14. The computer-readable storage medium of claim 13, wherein the thermal distribution can be used to validate the output of the Hall-effect RPM sensor, thereby improving fan operability assurance.

15. An apparatus for canceling fan noise in a computer system, comprising:

a microphone, which is configured to obtain a fan noise signal;

a spectral-pattern-generating mechanism configured to generate a spectral pattern based on the obtained fan noise signal;

an identifying mechanism configured to identify a cancellation spectrum in an anti-spectra library using the spectral pattern, wherein the anti-spectra library includes at least one cancellation spectrum computed based on a fan noise signal that includes a combination of multiple fan speeds; and a signal-generating mechanism configured to generate a noise-canceling signal using the cancellation spectrum;

wherein the amount of computation required to cancel fan noise is reduced because generating the noise-canceling signal using the anti-spectra library requires less computation than dynamically generating the noise-canceling signal.

16. The apparatus of claim 15, further comprising:

a computing mechanism configured to compute cancellation spectra based on fan noise signals measured at various fan speeds; and a storing mechanism configured to store the cancellation spectra in the anti-spectra library.

17. The apparatus of claim 15, wherein the identifying mechanism is configured to:

determine a fan speed based on the spectral pattern; and to identify the cancellation spectrum based on the fan speed.

18. The apparatus of claim 15, wherein the signal-generating mechanism is configured to play back the noise canceling signal on a speaker.

19. The apparatus of claim 15, wherein the apparatus is configured to:

detect one or more fan failures; and to stop noise-cancellation if one or more fan failures are detected, wherein stopping noise-cancellation can prevent suboptimal noise-cancellation because, if one or more fans fail, the spectral pattern can be substantially different from the cancellation spectrum which is associated with a system configuration in which all fans are operational.

20. The apparatus of claim 19, wherein detecting one or more fan failures involves:

determining a thermal distribution using thermal sensors, wherein an anomalous thermal distribution can indicate a fan failure; and determining whether a fan speed is below a normal operating speed using a Hall-effect RPM (revolution per minute) sensor.

21. The apparatus of claim 20, wherein the thermal distribution can be used to validate the output of the Hall-effect RPM sensor, thereby improving fan operability assurance.

* * * * *